United States Patent [19]

Wong et al.

[11] Patent Number: 4,859,870
[45] Date of Patent: Aug. 22, 1989

[54] TWO-MODE DRIVER CIRCUIT

[75] Inventors: Anthony Y. Wong, Cupertino; Daniel Wong, San Jose; Steven S. Chan, Fremont, all of Calif.

[73] Assignee: LSI Logic Incorporated, Milpitas, Calif.

[21] Appl. No.: 296,297

[22] Filed: Jan. 9, 1989

Related U.S. Application Data

[63] Continuation of Ser. No. 108,333, Oct. 14, 1987, abandoned.

[51] Int. Cl.[4] .................. H03K 17/16; H03K 17/687
[52] U.S. Cl. .................................. 307/263; 307/264; 307/443; 307/451
[58] Field of Search ............... 307/270, 443, 448, 263, 307/451, 264, 296.3

[56] References Cited

U.S. PATENT DOCUMENTS

| 3,959,782 | 5/1976 | Dunn | 307/443 |
|---|---|---|---|
| 4,473,762 | 9/1984 | Iwahashi et al. | 307/443 |
| 4,532,439 | 7/1985 | Koike | 307/451 |
| 4,540,904 | 9/1985 | Ennis et al. | 307/270 |
| 4,567,378 | 1/1986 | Raver | 307/443 |
| 4,578,600 | 3/1986 | Magee | 307/451 |
| 4,622,482 | 11/1986 | Ganger | 307/263 |
| 4,725,747 | 2/1988 | Stein et al. | 307/263 |

Primary Examiner—David Hudspeth
Attorney, Agent, or Firm—Townsend and Townsend

[57] ABSTRACT

A CMOS driver circuit for integrated circuits capable of operating in two modes. The first, high speed, mode allows the driver circuit on an integrated circuit device to drive the internal signals of the device to the outside world for standard operation of the integrated circuit devices. The second mode causes the driver circuit to behave as a weak driver for easily testing the integrated circuit.

20 Claims, 3 Drawing Sheets

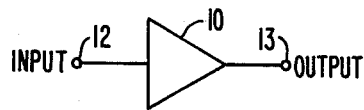
FIG._1A.
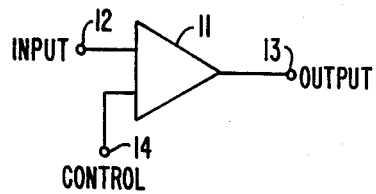
FIG._1B.
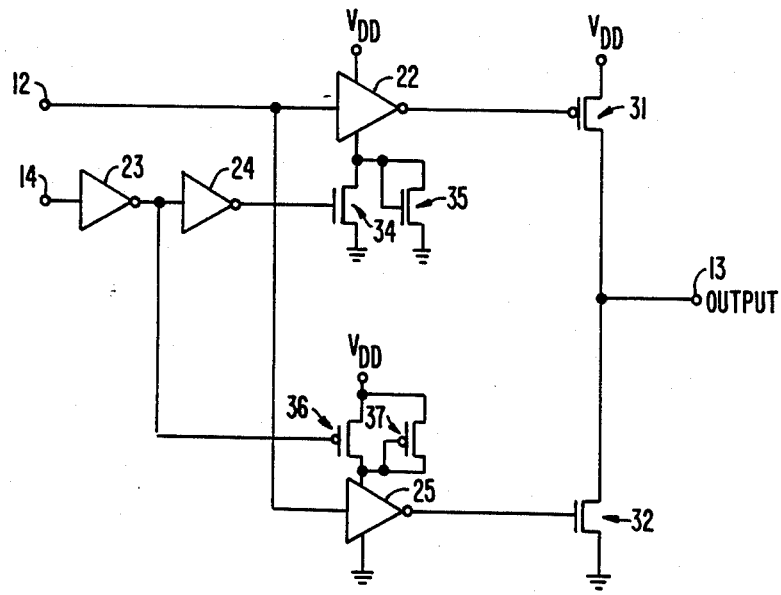
FIG._2.

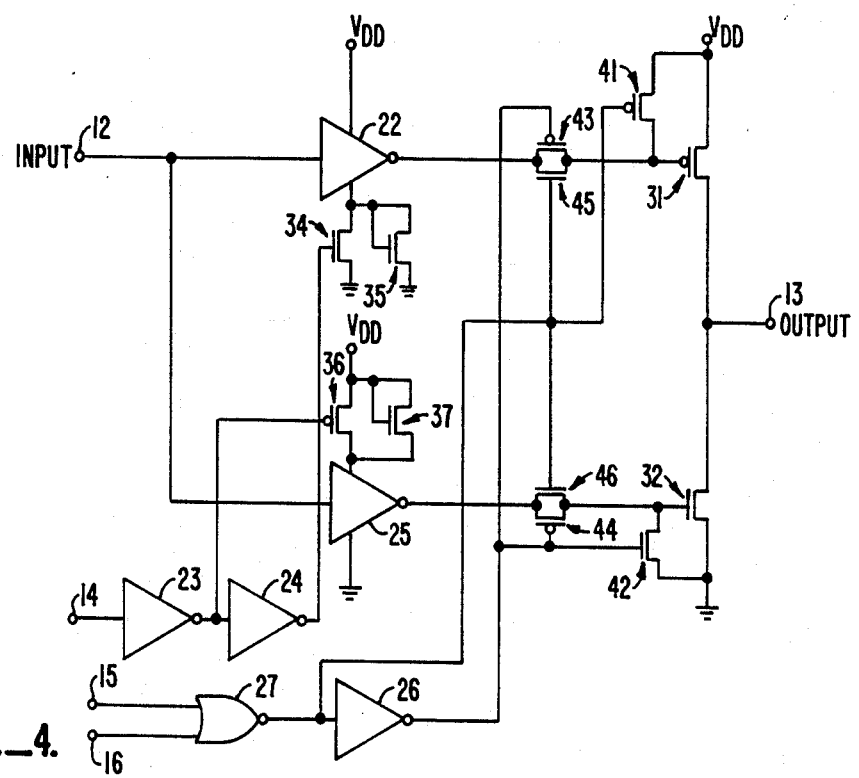
FIG._4.
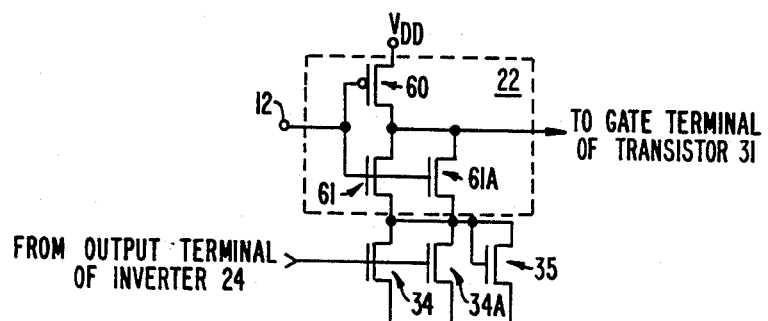
FIG._3A.
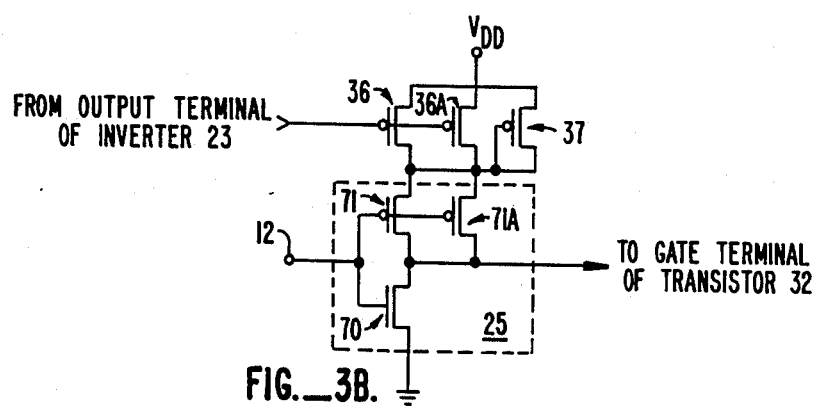
FIG._3B.

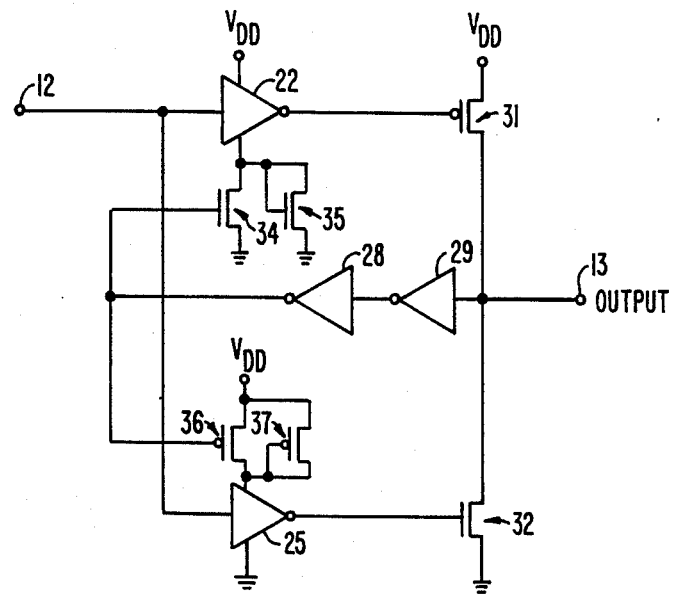
FIG._5A.
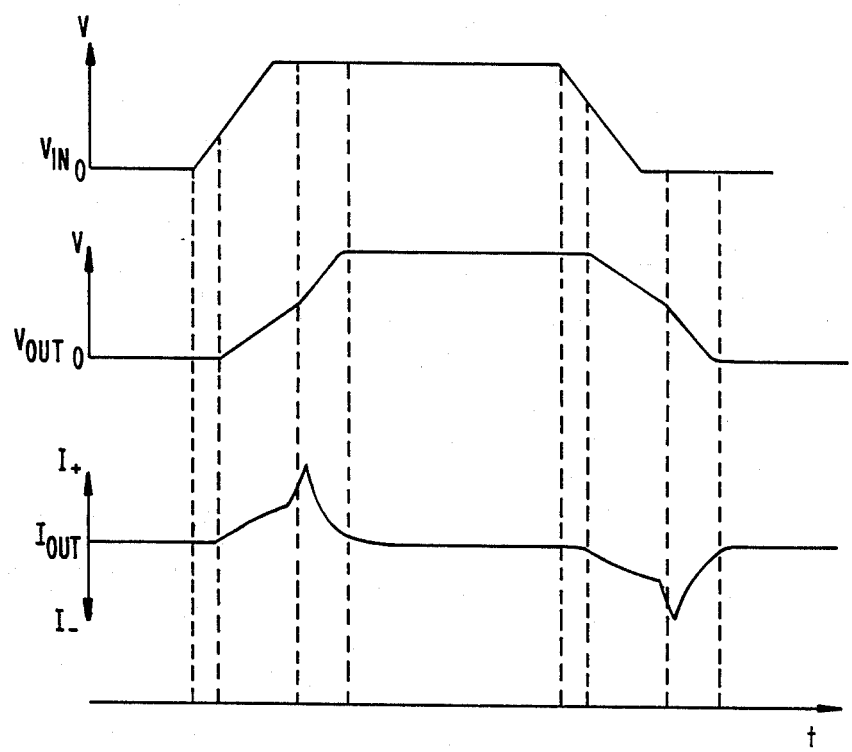
FIG._5B.

TWO-MODE DRIVER CIRCUIT

This is a continuation of application Ser. No. 108,333, filed Oct. 14, 1987, now abandoned.

FIELD OF THE INVENTION

The present invention relates to driver circuits of generating output signals from an integrated circuit and, more specifically, a CMOS driver circuit capable of operating in two modes for integrated circuits.

BACKGROUND OF THE INVENTION

Present day integrated circuits require an increasing number of lines connections by which the integrated circuit communicates with the outside world. Physically an integrated circuit has a number of metallic pads around the periphery of the integrated circuit chips; the pads are connected to the rest of the integrated circuit. In use the integrated circuit chip is protected by a package which contains a number of metallic connections, typically pins, which electrically connect the integrated circuit to the outside world. The connections or pins are connected to the pads by metallic wires.

Many of these connections transmit the integrated circuit's internally generated signals to the outside world. These output connections require driver, or buffer, circuits in the integrated circuit. These driver circuits generate the required voltages and currents for the signals to be properly propagated to the outside world.

In the process of manufacturing integrated circuits, there is typically a step in which the individual integrated circuits which have been manufactured on a single semiconductor substrate, called a wafer, are tested to determine whether each of the integrated circuits function properly or not before the integrated circuits are packaged. In this step, the wafer sort operation, each integrated circuit is tested by a number of probes which each contact the input/output pads of the integrated circuit. The other end of the probes are connected to a computer which, under the control of a test program, transmits test pattern signals to the integrated circuit and collects the responses for analysis. The proper signal responses determine that the integrated circuit is functional or not.

A problem arises, though, with these large number of output connections. Necessarily these driver circuits generate large amounts of surge currents as the driver circuits quickly switch back and forth from one logic state to another (logic 1 to logic 0 and vice versa). The problem during wafer sort is that the long conducting lines of the probes to the computer create electrical signal reflections and other noises. These erroneous signals are aggravated by the large surge currents created by the driver circuits to cause the testing computer to misread and not correctly analyze the integrated circuit under scrutiny.

The present invention is directed toward solving or substantially mitigating this problem by providing for a driver circuit which can operate in two modes. In the first mode, the driver circuit of the present invention operates normally, i.e., with large initial surge currents and quickly changing voltage levels to maintain the high speed operation of the integrated circuit. In the second mode, the driver circuit behaves as a weak driver so that during wafer sort the problems caused by large surge currents from a typical driver circuit are substantially reduced.

SUMMARY OF THE INVENTION

The present invention provides for a driver circuit having a pair of output transistors connected between two reference voltage supplies. The two MOS output transistors are connected serially with the output terminal of the driver circuit between the two output transistors. The two MOS output transistors operate in a complementary fashion so that when one transistor is off, the other transistor is on so that the output terminal of the driver is in one logic state or the other. To control the output transistors, each gate terminal of the MOS output transistor is connected to the output terminal of an inverter circuit.

The drive capability of these output transistors is controlled by the magnitude of voltage on the output transistor gates. Each of these inverter circuits, connected between the two reference voltage supplies, has its input terminal connected to the input terminal of the driver circuit. Each of the inverter circuits has a pair of transistors connected between itself and one of the reference voltage supplies. One of the transistors has its gate terminal connected in a diode configuration and the other has its gate terminal connected to a control terminal.

When the signal on the control terminal turns the second transistor on, the inverter circuit to which the transistor pair is connected has a full current path between the reference voltage supplies. Hence the inverter operates at optimum drive capability. If the signal on the control terminal turns off the second transistor, the only current path for the inverter circuit between itself and the reference voltage supply is through the diode-connected transistor. This affects the output voltage of the inverter and the voltage on the gate terminal of the connected output transistor. The change in gate terminal voltage reduces the output current and drive capability of the output transistor.

The present invention also offers a driver circuit which can operate in the two modes as described previously and also go into a third state, a state of high impedance, besides a logic 1 and logic 0 state.

The present invention also provides for a driver circuit which is automatically slowed for slew rate control. This is achieved by connecting the output terminal of the driver circuit to the control terminal for an automatic feedback control of the switching speed of the driver circuit.

BRIEF DESCRIPTION OF THE DRAWINGS

FIG. 1A shows a typical functional representation of a driver circuit with its input and output terminals;

FIG. 1B shows a functional representation of the present invention with an additional control terminal;

FIG. 2 shows the details of the driver circuit of the present invention;

FIG. 3A illustrates one of the CMOS inverter circuit used in driver circuits;

FIG. 3B illustrates another of the CMOS inverter circuits in FIG. 2;

FIG. 4 is a detailed diagram of another embodiment of the present invention, a driver circuit permitting the output terminal to go into a high impedance state;

FIG. 5A shows the details of an embodiment of the present invention with feedback for slew rate control for the driver circuit;

FIG. 5B shows the operation of the circuit illustrated in FIG. 5A.

It should be noted that same reference numerals are used in several of the drawings where the same element is intended.

DETAILED DESCRIPTION OF THE INVENTION

FIG. 1A illustrates functionally a driver circuit 10 having an input terminal 12 and an output terminal 13. The driver circuit 10 buffers the signal on the input terminal 12 to the output terminal 13.

FIG. 1B illustrates functionally the present invention, a driver circuit 11 which has the input and output terminals 12 and 13 described previously. Additionally, the present invention has a control terminal 14, through which the mode of operation of the driver circuit 11 is controlled. The driver circuit 11 can operate either in a high drive mode, or a low drive mode. As explained previously, the low drive mode is useful in reducing the amount of surge currents to prevent undesired anomalies when the circuit operating is a monitored circuit, such as the testing of the integrated circuit during the wafer sort operation.

FIG. 2 illustrates the details of the present invention. The driver circuit has two output transistors 31, 32 which are connected serially between two reference voltage supplies at $V_{DD}$, typically +5 volts, and ground, respectively. The transistor 31 is an MOS transistor with a P-channel, i.e., a PMOS transistor. One of the two source/drain regions of the transistor 31 is connected to the reference voltage supply at $V_{DD}$. The second source/drain region of the transistor 31 is connected to the output terminal 13 of the driver circuit.

The transistor 32 is, on the other hand, an MOS transistor with an N-channel, i.e., an NMOS transistor. One of its two source/drain regions is connected to the reference voltage supply at ground, while the other region is connected to the output terminal 13 and the second source/drain region of the transistor 31.

The gate terminals of the transistors 31, 32 are respectively connected to inverter circuits 22, 25. The input terminals of the inverter circuits 22, 25 are connected to the input terminal 12. Operationally, a high signal on the input terminal 12 generates a low signal on the gate terminal of the PMOS transistor 31 due to the action of the inverter circuit 22. Similarly, the inverter 25 places a low signal on the gate terminal of the NMOS transistor 32. Thus, the PMOS transistor 31 is turned on and the NMOS transistor 32 is turned off so that the voltage at the output terminal 13 is high. On the other hand, a low signal on the input terminal 12 turns off the PMOS transistor 31 and turns on the NMOS transistor 32. The signal on the output terminal 13 is thus low.

Each of the inverter circuits 22, 25 has at least a pair of transistors connected in parallel between itself and one of the two reference voltage supplies. The pair of transistors is illustrative of the present invention, though more than two transistors may operate more effectively in the driver circuit, as explained below. In the case of the inverter circuit 22, the parallel transistor pair 34, 35 is between the inverter 22 and ground. For the inverter circuit 25 the transistor pair 36, 37 is between the inverter 25 and the reference voltage supply at $V_{DD}$.

Each transistor pair has a transistor 34 (or 36) which has its gate terminal coupled to the control terminal 14 and a transistor 35 (or 37) which is in a diode-connected configuration. The gate terminal of the PMOS transistor 36 is connected to the control terminal 14 through an inverter 23; the gate terminal of the NMOS transistor 34 is connected to the control terminal 14 through the inverter 23 and a second inverter 24. The inverters 23, 24 invert or maintain the logic level of the control signal on the control terminal 14. When the signal on the control terminal 14 is high, the NMOS transistor 34 is turned on; similarly, the PMOS transistor 36 is also turned on through the operation of the inverter 23. This permits the current through the inverter circuits 22, 25 to flow unimpeded between the output terminal of the inverter 22 or 25 and the $N_{DD}$ or ground reference voltage supplies. The inverter 22 is effectively coupled to ground and the inverter 25 is likewise effectively coupled to $V_{DD}$. The output voltage of both inverters 22, 25 can swing fully between ground and $V_{DD}$, depending upon the signal level at input terminal 12.

However, when the signal on the control terminal 14 is low, the transistors 34, 36 are turned off and the current through the inverter circuits 22, 25 are forced through the diode-connected transistors 35, 37. The transistors 35, 37 are much smaller than the transistors 34, 36. Specifically, the channel widths of the transistors 35, 37 are much smaller than the channel widths of the transistors 34, 36. As a consequence, the output voltage of the inverters 22, 25 are restricted. The output voltage of the inverter 22 can only fall to a voltage approximately one diode voltage, $V_T$, above ground. Similarly, the output voltage of the inverter circuit 25 can only rise to one $V_T$ below $V_{DD}$. $V_T$ depends upon the specific parameters of the diode-connected transistor and typically varies from 1.0–1.5 volts. Also, the currents through the diode-connected transistors 35, 37 are reduced.

With the swing of the output voltages of the inverters 22, 25 reduced as explained above, the voltages of the gate terminals of the output transistors 31, 32 are also reduced. With less voltage on the gate terminals to turn on the output transistors 31, 32, the amount of output current through the output terminal 13 is lowered and the drive capability of the driver circuit is reduced.

On an integrated circuit the driver circuits shown in FIG. 2 may have their control terminal 14 connected to a single input pad. In this manner, a testing probe on that pad can place a low signal to all of the control terminals 14 of the driver circuits to place these driver circuits in a low drive mode. This permits testing of the integrated circuit to be accomplished more easily, as discussed previously.

FIGS. 3A and 3B, respectively, illustrate in detail the inverters 22, 25 with their transistor pairs 34, 35 and 36, 37. FIG. 3A shows the CMOS inverter 22, enclosed by a dotted line having a typical transistor pair, a PMOS transistor 60 and an NMOS transistor 61. Both transistors 60, 61 have their gate terminals connected to the input terminal 12. The output terminal of the inverter is connected to the drain region of the PMOS transistor 60 and the drain region of the NMOS transistor 61. This output terminal is connected to the gate terminal of the output transistor 31. Since the inverter 22 must be able to turn on the PMOS transistor 31, the inverter 22 has an additional NMOS transistor 61A connected in parallel to the NMOS transistor 61. This parallel combination of transistors 61, 61A optimizes the delay characteristics through the inverter 22. When the NMOS transistors 61, 61A are turned on, a larger amount of current can be pulled through the output terminal of the inverter 22 toward ground for faster switching. The parallel combination also insures that when the output terminal of the inverter 22 is to be pulled low toward ground, the voltage drop between the inverter output terminal and the ground reference supply is as small as possible.

Likewise, besides the transistor pair 34, 35, the transistor 34 has a second transistor 34A. This parallel-connected transistor 34A operates in the same manner as the transistor 61A in the inverter 22. That is, the parallel combination of the transistors 34, 34A optimizes the delay characteristics of the inverter 22. When the transistors 34, 34A are turned on, a larger amount of current may be pulled from the inverter 22 to ground than with the single transistor 34. The transistor 34A also cooperates with the transistor 34 to provide the smallest possible voltage drop between the inverter 22 and the ground reference voltage. Thus, the transistor 34A optimizes the operation and function of the transistor 34.

FIG. 3B details the inverter 25 and a variation on the transistor pair 36, 37 as described previously. The inverter 25 enclosed by a dotted line has the typical complementary transistor pair, an NMOS transistor 70, and PMOS transistor 71. The gate terminals of the transistors 70, 71 are connected to the input terminal 12. The drain regions of the NMOS transistor 70 and PMOS transistor 71 are connected to the output terminal of the inverter 25, which is connected to the gate terminal of the output transistor 32. To insure that the delay through the inverter 25 is optimized, the inverter 25 has a second PMOS transistor 71A connected in parallel to the transistor 71. The parallel transistor 71A helps supply a larger amount of current from the $V_{DD}$ reference voltage supply to the output terminal of the inverter 25 when the transistors 71, 71A are switched on. The transistor 71A also insures that the output terminal of the inverter 25 is as close as possible to the $V_{DD}$ reference voltage.

Furthermore, the transistor pair 36, 37 described above has a third transistor 36A which is connected in parallel to the PMOS transistor 36. The extra transistor 36A insures that the switching delay through the inverter 25 is optimized in the same manner as described for the transistor 71A.

FIG. 4 shows another embodiment of the present invention which permits the driver circuit to operate in the high and low drive modes as explained previously. The circuit in FIG. 4 also permits the output terminal 13 to go into a third state, a high impedance state, besides the logic high and logic low states. The circuit in FIG. 4 has parallel switching transistors 43, 45 between the gate terminal of the PMOS output transistor 31 and the output terminal of the inverter circuit 22. The gate terminal of the output transistor 31 is also connected to a PMOS clamping transistor 41, which has one of its source/drain regions connected to the transistor 31 gate electrode and the other source/drain region connected to the reference voltage supply at $V_{DD}$. The gate electrode of the clamping transistor 41 is connected to an output terminal of a NOR gate 27 with two input terminals 15, 16.

In a similar fashion there are switching transistors 44, 46 connected in parallel between the gate electrode of the NMOS output transistor 32 and the output terminal of the inverter circuit 25. The gate terminal of the output transistor 32 is also connected to an NMOS clamping transistor 42 having one of its source/drain regions connected to the transistor 32 gate electrode and the other source/drain region to ground. The gate electrode of the clamping transistor 42 is connected to the output terminal of the NOR gate 27 through an inverter circuit 26.

When the signal at the output terminal of the NOR gate 27 is low, the NMOS switching transistors 45, 46 are turned off. The PMOS switching transistors 43, 44 are also turned off through the operation of the inverter 26. With the NMOS transistors 45, 46 and the PMOS transistors 43, 44 off, the gate terminals of the output transistors 31, 32 are respectively isolated from the output terminals of the inverter circuits 22, 25. Furthermore, the low signal at the output terminal of the NOR gate 27 turns on the clamping transistor 41. The gate terminal of the PMOS output transistor 31 is effectively clamped to a high voltage near $V_{DD}$ and the transistor 31 is turned off. The low signal is also inverted to a high signal by the inverter 26 to turn on the clamping transistor 42. Thus, gate terminal of the NMOS output transistor 32 is clamped to the low voltage near ground to turn the transistor 32 effectively off. The output terminal 13 is now cut off; it is in a high impedance state.

On the other hand, a high signal at the output terminal of the NOR gate 27 turns on the NMOS switching transistors 45, 46 and the PMOS switching transistors 43, 44 are also turned on through the action of the inverter 26. The two clamping transistors 41, 42 are turned off at the same time. The gate terminal of the PMOS output transistor 31 is thus connected to the output terminal of the inverter circuit 22 and the gate terminal of the NMOS output transistor 32 is connected to the output terminal of the inverter circuit 25. The driver circuit now operates as described previously.

The NOR gate 27 has two control terminals 15, 16 to effect the high impedance state of the driver circuit. One of the control terminals, say terminal 15, may be used to control the impedance state of each driver circuit individually, while the other terminal 16 can be connected to an input pad on the integrated circuit. This input pad is connected to similar control terminals 16 of other driver circuits on the integrated circuit. In the wafer sort operation when the probe to that input pad is high, all the driver circuits connected to the pad go into a high impedance state. This operation is useful for testing the integrated circuit also, specifically parametric DC testing of the integrated circuit.

In FIG. 5A the present invention provides for a driver circuit which has an output slew rate control. Instead of the transistor pair 34, 36 responding to the signal of the control terminal 14 as depicted in FIG. 2, the gate terminals of the transistors 34, 36 are connected to the output terminal 13 through two inverters 28, 29. By this feedback connection the driver circuit is always slowed down. For example, as the signal on the input terminal 12 rises for a high signal, the signal on the gate terminal of the NMOS transistor 34 is kept low. The transistor 34 remains off. The current through the inverter circuit 22 is limited by the small channel width of the diode-connected transistor 35.

When the voltage on the output terminal 13 reaches the threshold voltage of the inverter 29, the voltage on the gate terminal of the transistor 34 through the inverter circuits 28, 29 are sufficient to turn on the transistor 34. The full current through the transistor 34 allows the inverter circuit 22 to operate in a full voltage swing between $V_{DD}$ and ground. The output transistor 31 is quickly and fully turned on.

Similarly, when the driver circuit switches from a high logic level to a low logic level, the initial high voltage on the gate terminal of the PMOS transistor 36 relayed by two inverter circuits 28, 29 keeps that transistor 36 off. By the low current flow through the diode-connected transistor 37, the inverter 25 slowly switches to turn on the NMOS output transistor 32. When the output terminal 13 reaches the threshold voltage of the inverter 29, the transistor 36 is turned on and the inverter 25 operates with a full voltage swing. The transistor 32 is quickly and fully turned on and the signal at the output terminal 13 is low.

This operation is shown in FIG. 5B, which shows voltage and current signals over a horizontal time axis. $V_{IN}$ is the input voltage signal at the input terminal 12; $V_{OUT}$ is the output voltage signal at the output terminal 13. $I_{OUT}$ is the current through the output terminal 13. As indicated by the FIG. 5B, the current can flow from the terminal 13, $I_{OUT}$ positive, and can flow into the terminal 13, $I_{OUT}$ negative From the $V_{OUT}$ signal it can be seen how each rising and falling slope of the voltage has a "knee," indicative of the slow and then fast operation of the driver circuit.

This feedback connection slows down the switching speed of the driver circuit somewhat. This driver circuit with reduced speed is useful in preventing high surge currents through the output transistors 31, 32 caused by a driver circuit operating at full speed. The reduction in surge currents avoids undesirable noise in the circuits. However, the feedback implementation of the present invention does not reduce the drive capability of the driver circuit since each of the output transistors 31, 32 are appropriately turned fully on after the delay in switching.

As will be understood by those familiar with the art, the present invention may be embodied in other specific forms without departing from the spirit or essential characteristics thereof. Accordingly, the disclosure of the embodiment of the invention is intended to be illustrative, but not limited, of the scope of the invention which is set forth in the following claims.

What is claimed is:

1. For connection to an MOS inverter circuit having an input terminal, an output terminal, first and second power terminals for connection to first and second reference voltage supplies respectively, a circuit comprising:
    a pair of MOS transistors connected in parallel between one of said first and second power terminals and one of said first and second reference voltage supplies, said first MOS transistor having its gate electrode connected to a third terminal, said second MOS transistor having its gate connected to its source or drain region for diode operation and having a channel width much smaller than channel width of said first MOS transistor;
    whereby the output terminal voltage swing of said MOS inverter circuit operation is reduced when a signal on said third terminal turns off said first MOS transistor.

2. A circuit as in claim 1 wherein said inverter circuit is a CMOS inverter circuit.

3. A circuit as in claim 2 wherein said first reference voltage supply is at a higher voltage than said second reference voltage supply and said MOS transistor pair are connected between said first reference voltage supply and said first power terminal.

4. A circuit as in claim 3 wherein said MOS transistor pair are PMOS transistors.

5. A circuit as in claim 2 wherein said first reference voltage supply is at a higher voltage than said second reference voltage supply and said MOS transistor pair are connected between said second reference voltage supply and said second power terminal.

6. A circuit as in claim 5 wherein said MOS transistor pair are NMOS transistors.

7. A circuit as in claim 1 further comprising a third MOS transistor connected in parallel to said first MOS transistor.

8. A CMOS driver circuit having first and second power terminals for connection to first and second reference voltage supplies respectively, an input terminal and an output terminal, comprising:
    first and second MOS output transistors, each MOS output transistor having first and second source/drain terminals and a gate terminal, said first source/drain terminal of said first MOS output transistor connected to said first power terminal, said second source/drain terminal of said first MOS output transistor connected to said driver circuit output terminal and to said first drain source/drain terminal of said second MOS output transistor, and said second source/drain terminal of said second MOS output transistor connected to said second power terminal;
    a first and second CMOS inverter, each having first and second power terminals for connection to said first and second reference voltage supplies respectively, an input terminal and an output terminal, said input terminals of both CMOS inverters connected to said driver circuit input terminal, said output terminal of said first CMOS inverter connected to said gate terminal of said first MOS output terminal, said output terminal of said second CMOS inverter connected to said gate terminal of said second MOS output terminal;
    means, having a third terminal and connected between one of said first and second power terminals each of said CMOS inverters and one of said first and second reference voltage supplies, for reducing the output terminal voltage swing of said CMOS inverter responsive to a signal on said third terminal.

9. A CMOS driver circuit as in claim 8
    wherein said output voltage swing reducing means comprises first and second MOS transistors connected in parallel between one of said first and second power terminals and one of said first and second reference voltage supplies, said first MOS transistor having its gate electrode connected to said third terminal, said second MOS transistor having its gate electrode connected to its source or drain region for diode operation, and having a channel width much smaller than that of said first MOS transistor; and
    whereby said driver circuit operation is slowed when a signal on said third terminal turns off said first MOS transistor.

10. A plurality of said CMOS driver circuits as in claim 9 on an integrated circuit, said third terminals of said CMOS driver circuits connected to an input pad whereby operations of all of said CMOS driver circuits are slowed by a signal on said input pad.

11. A CMOS driver circuit as in claim 9 wherein:

said first reference voltage supply is at a higher voltage that said second reference voltage supply;

said first CMOS inverter having its first and second MOS transistor connected in parallel between said first reference voltage supply and said first power terminal, and said channel regions of said first and second MOS transistors being of a first polarity type; and said second CMOS inverter having its first and second MOS transistors connected in parallel between said second reference voltage supply and said power terminal, and said channel regions of said first and second MOS transistors being of a second polarity type.

12. A CMOS driver circuit as in claim 11 wherein said first and second transistors of said first CMOS inverter are NMOS transistors and said first and second transistors of said second CMOS inverter are PMOS transistors.

13. A CMOS driver circuit as in claim 9 wherein said third terminal is connected to said output terminal whereby said driver circuit is partially slowed by feedback action from said output terminal to said first MOS transistor.

14. A CMOS driver circuit as in claim 9 further comprising:

first switching means, having a control terminal, between each of said output terminals of said CMOS inverters and said gate terminal of said MOS output transistors respectively for decoupling said CMOS inverter output terminal from said gate terminal upon a signal to said control terminal, said control terminal connected to a fourth input terminal;

second switching means, having a control terminal, for connecting each of said gate terminals of said MOS output transistors to said one of said reference voltage supplies respectively upon a signal to said control terminal, said control terminal connected to said fourth input terminal;

whereby said CMOS driver circuit is placed into a high impedance state upon a signal on said fourth input terminal.

15. An integrated circuit having at least one input pad and a plurality of CMOS driver circuits as in claim 14, each fourth input terminal of said driver circuits connected to said input pad whereby a signal on said input terminal places all of said CMOS driver circuits into a high impedance state.

16. The CMOS driver circuit as in claim 14 wherein said first switching means comprises a pair of MOS transistors of opposing polarity, each MOS transistor having a first source/drain region connected to said output terminal of said CMOS inverter, a second source/drain region connected to said gate terminal of said MOS output terminal and a gate terminal connected to said fourth input terminal.

17. The CMOS driver circuit as in claim 14 wherein said second switching means comprises an MOS transistor having a first source/drain region connected to said reference voltage supply, a second source/drain region connected to said gate terminal of said MOS output transistor and a gate terminal connected to said fourth input terminal.

18. The CMOS driver circuit as in claim 14 further comprising a logic gate having an output terminal connected to said fourth input terminal and at least two input terminals.

19. An integrated circuit having at least one input pad and a plurality of CMOS driver circuits as in claim 16 wherein one of said two input terminals is connected to said input pad whereby a signal on said input pad places all of said CMOS driver circuits into a high impedance state.

20. The CMOS driver circuit as in claim 9 further comprising a third MOS connected in parallel with said first MOS transistor.

* * * * *

UNITED STATES PATENT AND TRADEMARK OFFICE
CERTIFICATE OF CORRECTION

PATENT NO. : 4,859,870

DATED : August 22, 1989

INVENTOR(S) : Anthony Y. Wong et. al.

It is certified that error appears in the above-identified patent and that said Letters Patent is hereby corrected as shown below:

Claim 8, column 8, line 36-37, please change "MOS output terminal" to --MOS output transistor--;

Claim 8, column 8, line 40, please change "MOS output terminal" to --MOS output transistor--.

Signed and Sealed this

Fourth Day of September, 1990

*Attest:*

HARRY F. MANBECK, JR.

*Attesting Officer*  *Commissioner of Patents and Trademarks*